United States Patent
Gerding

(10) Patent No.: US 8,416,124 B2
(45) Date of Patent: Apr. 9, 2013

(54) FREQUENCY SYNTHESIZER FOR A LEVEL MEASURING DEVICE AND A LEVEL MEASURING DEVICE

(75) Inventor: Michael Gerding, Bochum (DE)

(73) Assignee: KROHNE Messtechnik GmbH, Duisburg (DE)

( * ) Notice: Subject to any disclaimer, the term of this patent is extended or adjusted under 35 U.S.C. 154(b) by 269 days.

(21) Appl. No.: 12/833,113

(22) Filed: Jul. 9, 2010

(65) Prior Publication Data

US 2011/0006811 A1    Jan. 13, 2011

(30) Foreign Application Priority Data

Jul. 10, 2009  (DE) .......................... 10 2009 032 811

(51) Int. Cl.
*G01S 13/08*   (2006.01)
(52) U.S. Cl.
USPC .......................................... 342/124; 342/118
(58) Field of Classification Search .................. 342/118, 342/124, 165, 168, 175, 195; 708/271
See application file for complete search history.

(56) References Cited

U.S. PATENT DOCUMENTS

| | | | | |
|---|---|---|---|---|
| 4,503,433 A | * | 3/1985 | Tomasi | 342/87 |
| 4,504,833 A | * | 3/1985 | Fowler et al. | 342/22 |
| 4,965,533 A | * | 10/1990 | Gilmore | 331/18 |
| 5,210,539 A | * | 5/1993 | Voyce | 342/83 |
| 5,606,324 A | * | 2/1997 | Justice et al. | 342/62 |
| 5,673,007 A | * | 9/1997 | Kirisawa | 331/18 |
| 5,777,574 A | * | 7/1998 | Robinson | 342/25 A |
| 5,943,010 A | * | 8/1999 | Rudish et al. | 342/372 |
| 6,118,345 A | * | 9/2000 | Scheffold | 331/11 |
| 6,384,770 B1 | * | 5/2002 | de Gouy et al. | 342/120 |
| 6,411,093 B2 | | 6/2002 | Schwilch et al. | |

(Continued)

FOREIGN PATENT DOCUMENTS

| | | |
|---|---|---|
| GB | 1 348 221 A1 | 3/1974 |
| WO | 96/28890 A1 | 9/1996 |

OTHER PUBLICATIONS

Arthur Torosyan and Alan N. Willson, Jr., Analysis of the Output Spectrum for Direct Digital Frequency Synthesizers in the Presence of Phas Truncation and Finite Arithmetic Precision,Image and Signal Processing and Analysis, 2001, ISPA 2001, Proceedings of the 2nd International Symposium on, pp. 458-463, 2001.

*Primary Examiner* — Jack W Keith
*Assistant Examiner* — Peter Bythrow
(74) *Attorney, Agent, or Firm* — Roberts Mlotkowski Safran & Cole, P.C.; David S. Safran

(57) ABSTRACT

A frequency synthesizer for a time base generator of a level measuring device which works according to the radar principle, with at least one first output for output of a first frequency signal, with at least one second output for output of a second frequency signal, and with a reference oscillator for producing a reference frequency signal, the first frequency signal and the second frequency signal having a small difference frequency relative to one another, the first frequency signal being producible by interaction of the reference oscillator with a direct digital synthesizer. The first frequency signal and second frequency signal can be generated with especially low noise by the second frequency signal being derived from the reference oscillator without interconnection of a direct digital synthesizer and the direct digital synthesizer being operated such that only a noise spectrum is produced which is at least partially minimized.

15 Claims, 1 Drawing Sheet

U.S. PATENT DOCUMENTS

| | | | |
|---|---|---|---|
| 6,486,826 B1* | 11/2002 | Cramer et al. | 342/124 |
| 7,002,511 B1* | 2/2006 | Ammar et al. | 342/134 |
| 7,176,822 B2* | 2/2007 | Schimper | 341/143 |
| 7,302,237 B2 | 11/2007 | Jackson et al. | |
| 7,737,880 B2* | 6/2010 | Vacanti | 342/70 |
| 2005/0003785 A1* | 1/2005 | Jackson et al. | 455/260 |
| 2005/0068115 A1* | 3/2005 | Atsumi et al. | 331/94.1 |
| 2005/0141594 A1* | 6/2005 | Smith et al. | 375/130 |
| 2007/0139259 A1* | 6/2007 | Vacanti | 342/173 |
| 2007/0192391 A1* | 8/2007 | McEwan | 708/271 |
| 2007/0210955 A1* | 9/2007 | McEwan | 342/175 |
| 2008/0019422 A1* | 1/2008 | Smith et al. | 375/136 |
| 2008/0159370 A1* | 7/2008 | Atherton | 375/232 |
| 2010/0283656 A1* | 11/2010 | Zavrel et al. | 342/14 |
| 2011/0227784 A1* | 9/2011 | Beasley et al. | 342/195 |

* cited by examiner

FREQUENCY SYNTHESIZER FOR A LEVEL MEASURING DEVICE AND A LEVEL MEASURING DEVICE

BACKGROUND OF THE INVENTION

1. Field of the Invention

The invention relates to a frequency synthesizer, especially for a time base generator of a level measuring device which works according to the radar principle, with at least one first output for outputting of a first frequency signal, with at least one second output for outputting of a second frequency signal, and with a reference oscillator for producing a reference frequency signal, the first frequency signal and the second frequency signal having a small difference frequency relative to one another, the first frequency signal being producible by interaction of the reference oscillator with a direct digital synthesizer. Furthermore, the invention also relates to a level measuring device which works according to the radar principle with a frequency synthesizer for producing a first frequency signal—sampling signal—and for producing a second frequency signal—transmission signal.

2. Description of Related Art

Frequency synthesizers of the above mentioned type have been known for some time, especially in the field of measurement engineering. Frequency synthesizers which have two frequency signals with only a small difference frequency relative to one another are often used as a time base generator for level measuring devices which work according to the radar principle. The frequency synthesizer described here is also suitable for other applications, but the technical requirements imposed on frequency synthesizers can be explained especially well using distance measurements based on radar.

Level measuring devices which work according to the radar principle emit electromagnetic waves which typically have frequencies in the MHz to GHz range into the observed section of space. These electromagnetic waves are reflected on the contents which are to be detected and travel back to the level measuring device where they are, in turn, detected. The transit time of the transmission signal is proportional to the distance of the level measuring device—more accurately of the transducer of the level measuring device—from the contents. As a result of the propagation velocity of the electromagnetic waves near the speed of light in the monitored section of space, the transit times of the electromagnetic transmission signal which can, optionally, be in the region of a few nanoseconds are very small even if distances in the range of a few dozen centimeters are to be detected.

Detection of these small transit times imposes very high demands on the measurement engineering being used, it making no difference whether the emitted electromagnetic waves are emitted via an antenna or whether radar measurement takes place using a wave guide (time domain reflectometry).

In order to be able to detect reflected periodic electromagnetic waves correctly using measurement engineering, a sampling rate which corresponds to more than twice the frequency of the transmission signal (Nyquist criterion) is necessary, using a sampling process which works in real time. For sampling of reflected microwaves with the associated short signal transmit times, this necessitates sampling frequencies which can be managed only with exceedingly high circuitry cost.

In order to be able to detect such high-speed processes even with less complex means, the prior art discloses, not detecting a single reflected transmission signal with a high sampling rate, but detecting a host of reflected transmission signals in succession with sampling which is slightly offset in time from sampling step to sampling step, its being assumed that nothing changes in the situation which is to be detected using measurement engineering during sampling of the many different transmission pulses so that, therefore, a steady state is observed during measurement. This sampling is also known as a "serial sampling" or as "slow motion sampling".

To implement this serial sampling, frequency synthesizers are used which output a first frequency signal at their first output and a second frequency signal at their second output, the first frequency signal and the second frequency signal having only a small frequency difference relative to one another. The second frequency signal is—to remain in the example of radar distance measurement—the transmission signal of a level measuring device which is emitted and later reflected. The first frequency signal is used for sampling which is continuously shifted farther, or for fixing the instant of this sampling, i.e., sampling of the second frequency signal so that the first frequency signal has a frequency which is slightly shifted relative to the second frequency signal. If the first frequency signal has a frequency $f_1$, and the second frequency signal has a frequency $f_2$, the frequency $f_1$ of the first frequency signal and the frequency $f_2$ of the second frequency signal differ by the difference frequency $\Delta f$ according to $$\Delta f = |f_2 - f_1| \quad (1)$$

The ratio of the frequency $f_2$ of the second frequency signal to the difference frequency $\Delta f$ is the factor by which the reflected transmission signal to be scanned is stretched, and thus, is compressed accordingly in the frequency range, by which ultimately processing of the received signal is possible in a lower frequency range than that of the transmission signal. In practice, the difference frequency $\Delta f$ between the first frequency signal and the second frequency signal is often in the region of only a few 100 Hz, partially even only at a few hertz, and therefore, in the frequency range in which the detection of the transmission signal using measurement engineering is easily possible.

In methods for distance measurement based on determining the transit time with serial sampling, the accuracy of the determined distance is directly related to the accuracy with which the difference frequency $\Delta f$ can be maintained so that high measurement accuracy can be achieved here only by high stability at the difference frequency.

Known frequency synthesizers generally work with phase locked loops with which certain phases and frequency shifts that can be set, these circuits being comparatively complex since they require, for example, tunable oscillators (for example, VCO). Moreover these frequency synthesizers have a comparatively long transient recovery time in order to deliver a stable difference frequency or to change to another difference frequency.

Fundamentally, implementing a frequency synthesizer using direct digital synthesizers is also known; the latter are conventionally available as integrated semiconductor circuits and can produce a frequency-adjustable and phase-adjustable output signal which can be varied within wide limits and at high speed. Approaches are known in which the first frequency signal and the second frequency signal are each generated by separate direct digital synthesizers.

A direct digital synthesizer is a digital circuitry component which, on the output side, conventionally has a digital/analog converter and which makes it possible to produce a frequency-adjustable and phase-adjustable output signal, and the direct digital synthesizer itself can be clocked with a certain frequency signal. Essentially direct digital synthesizers have a so-called phase accumulator which is nothing more than a clocked counter which activates a phase storage. In the phase storage, the amplitude values of the frequency signal which belong to the respective phase are filed; therefore, for example, the amplitude values of a sinusoidal oscillation are stored. Due to clocked counting-up of the phase in the phase accumulator, the phase storage delivers the amplitude of the frequency signal which corresponds to the phase in digital form to a digital-analog converter which converts this value into an analog voltage signal. Often, the phase accumulators are controllable by it being possible to stipulate to them how many filed phase values are to be skipped for each increment. This property can then be parameterized by way of stipulating a shift word, the phase accumulator then fundamentally working as a variable modulus counter.

Aside from the fact that the approach to implementing a frequency synthesizer using two direct digital synthesizers is comparatively costly, it also has technical disadvantages which are related to the spectral interference which is conventionally produced by direct digital synthesizers.

SUMMARY OF THE INVENTION

Therefore, a primary object of this invention is to provide a frequency synthesizer and a level measuring device using direct digital synthesizers which avoids the aforementioned disadvantages, at least in part.

Proceeding from the initially described type of frequency synthesizer, the aforementioned object is achieved in that the second frequency signal is derived from the reference oscillator without interconnection of another direct digital synthesizer and the direct digital synthesizer is operated such that only a noise spectrum is produced which is at least partially minimized.

It has been recognized in accordance with the invention that a frequency synthesizer implemented using direct digital synthesizers tends greatly to producing not only a signal—generally a sinusoidal oscillation—with the desired frequency, but conventionally also produces noise signals at other frequencies which can be more or less remote from the frequency signal which has actually been output. Furthermore, in accordance with the invention, it has been recognized that, in particular, the use of two or more direct digital synthesizers, especially of the same design, is unsuitable within a frequency synthesizer circuit, especially when the first frequency signal and the second frequency signal have only a small difference frequency relative to one another, as is indeed required. The frequency synthesizer in accordance with the invention, by using only a single direct digital synthesizer, makes it possible to operate this direct digital synthesizer in a selected mode such that the generated noise spectrum is at least partially minimized, by which frequency signals which are closely adjacent in terms of frequency can be produced with a good signal-to-noise ratio with the simultaneous use of the advantages of direct digital synthesizers, such as, for example, almost delay-free frequency changing.

It has also been recognized in accordance with the invention that there are various possibilities for operating the direct digital synthesizer provided in the frequency synthesizer such that the noise spectrum produced by the direct digital synthesizer is at least partially minimized; the partial minimization takes place either with respect to quantization noise of the digital/analog converter used and/or with respect to phase truncation which is free of noise lines; this is explained in detail below.

According to a first preferred configuration of the frequency synthesizer in accordance with the invention, the noise spectrum is partially minimized by a digital/analog converter which is achieved by the direct digital synthesizer being operated at maximum resolution. This measure results in that the effect of the quantization error which is present in any digital/analog converter, specifically the quantization noise of the output signal associated with the quantization error, is minimized. By using the maximum resolution of the digital/analog converter, the best possible approximations of the frequency signal to an ideal sinusoidal signal can be achieved with the existing means of the digital/analog converter used so that the power entering the noise spectrum overall is minimized and as a result a partially minimized noise spectrum of the frequency synthesizer is implemented.

Further partial minimization of the noise spectrum according to one preferred configuration of the frequency synthesizer in accordance with the invention can be implemented by the digital/analog converter which is encompassed by the direct digital synthesizer being operated at a frequency in oversampling, especially at maximum frequency. This configuration is based on the finding that the noise power of the digital/analog converter present at a certain quantization is independent of the frequency at which the digital/analog converter is operated, but this noise power which is quantitatively invariable at a fixed operating frequency is spectrally distributed depending on the operating frequency of the digital/analog converter. With an increasing sampling frequency the expansion of the noise frequency spectrum also increases, in contrast, however, the amplitude of the distributed noise lines decreases so that in the frequency range under examination the noise power which belongs to this frequency range decreases with increasing sampling frequency. The proposed measure, therefore, results in that the noise power which is present at a certain frequency becomes smaller at an increasing sampling frequency and thus the noise ratio between the useful signal and the noise signal (ratio of the useful signal power to the quantization noise power) is partially maximized.

One quite especially preferred configuration of the invention is characterized in that the direct digital synthesizer is operated with those phase shifts which do not produce noise lines as a result of phase truncation.

Conventionally, direct digital synthesizers are operated with a lower phase resolution than is theoretically possible. This takes place for example, in order to be able to provide a smaller phase storage than would be necessary at maximum exhaustion of the resolution of the phase accumulator. If, for example, the phase accumulator has n-bits, for output of the corresponding values from the phase storage only the m most significant bits (MSBs) are used for actual phase resolution; the lower (n-m) bits remain ignored; the least significant (n-m) bits of the phase accumulator are cut off, in other words, truncated. The phase values resulting from the described truncation of the phase accumulator at the incrementing instants generally deviate from those angular values which would arise with consideration of the full resolution of the phase accumulator and of the phase storage, the resulting errors periodically repeating. This effect is, moreover, dependent on the shift word with which the direct digital synthesizer can be additionally parameterized and which indicates how many values are skipped at an increment in the phase accumulator. The periodic errors caused by phase truncation, in any case, as a result of periodicity lead to noise lines in the frequency spectrum; in accordance with the invention, those truncations are now used which, by way of exception, do not produce periodic errors.

According to one especially preferred configuration of the invention, for a frequency synthesizer with a direct digital synthesizer which comprises an n-bit phase accumulator and a phase storage triggered by the phase accumulator, the phase accumulator being parameterizable with an n-bit shift word, only the m most significant bits (MSBs) of the phase accumulator being used to activate the phase storage, the n-bit shift word is chosen such that, at bit position (n-m), there is a 1 and all lower bit positions are occupied by zeros. Only for these special shift words can noise lines as a result of phase truncation be avoided; in turn, this illustrates that it is essentially impossible to use known frequency synthesizers with two direct digital synthesizers for producing two frequency signals with a small difference frequency since this is essentially impossible free of noise lines under the aforementioned criterion of phase truncation which is free of periodic errors.

In one especially advantageous configuration of the invention, at least one bandpass filter is connected downstream of the direct digital synthesizer and greatly attenuates or suppresses all signals transmitted by it outside its passband. This makes it possible to operate the direct digital synthesizer even with those phase shifts which do produce noise lines as a result of phase truncation, but only those noise lines which are in the blocking region of the bandpass filter connected downstream of the direct digital synthesizer. In this way, considerably more frequencies are possible for the direct digital synthesizer than in the exclusive selection of phase shifts which do not produce noise lines as a result of phase truncation, as has been required in the past. Suitable shift words for this operation can, for example, also be experimentally found by the shift word in the desired frequency range being systematically varied and the noise line spectrum being detected until a noise line spectrum has only noise lines at frequencies on the other side of the passband of the bandpass filter.

In other preferred exemplary embodiments which are detailed in the description of the figures, one or more preferably programmable frequency dividers are used. In addition to the additional degree of freedom obtained therewith in the selection of a suitable frequency combination, by using one or more frequency dividers, an improved signal-to-noise ratio is furthermore achieved. The additionally obtained noise line margin arises, for example, for a division factor M at 20 log (M) in dB. The noise signals, as described above, are produced by the digital/analog converter of the direct digital synthesizer and by periodic errors due to phase truncation, but it can also be a matter of phase noise which is associated with the use of the reference oscillator, since the reference oscillator, and thus, the reference frequency signal, generally not only have the desired reference frequency, but also deliver other unwanted frequency portions, and these frequency portions, depending on the quality factor of the oscillator, are pronounced to different degrees.

In other advantageous configurations of the invention, the frequency synthesizer is operated at a frequency of the direct digital synthesizer which is as large as possible or maximum. This is also advantageous for the various, already described reasons, but also advantageous because the signal-to-noise ratio can be still further improved using other frequency dividers or frequency dividers with larger divider factors for setting the desired frequency signals.

According to one independent teaching of the invention, the initially described object is obtained in a level measuring device which works according to the radar principle and which has a frequency synthesizer for producing a first frequency signal—sampling signal—and for producing a second frequency signal—transmission signal—by the frequency synthesizer being implemented in the above described manner.

In particular, there are various possibilities for embodying and developing the frequency synthesizer in accordance with the invention and the level measuring device in accordance with the invention. In this respect reference is made to the detailed description of preferred exemplary embodiments in conjunction with the drawings.

DETAILED DESCRIPTION OF THE INVENTION

Figure 1:
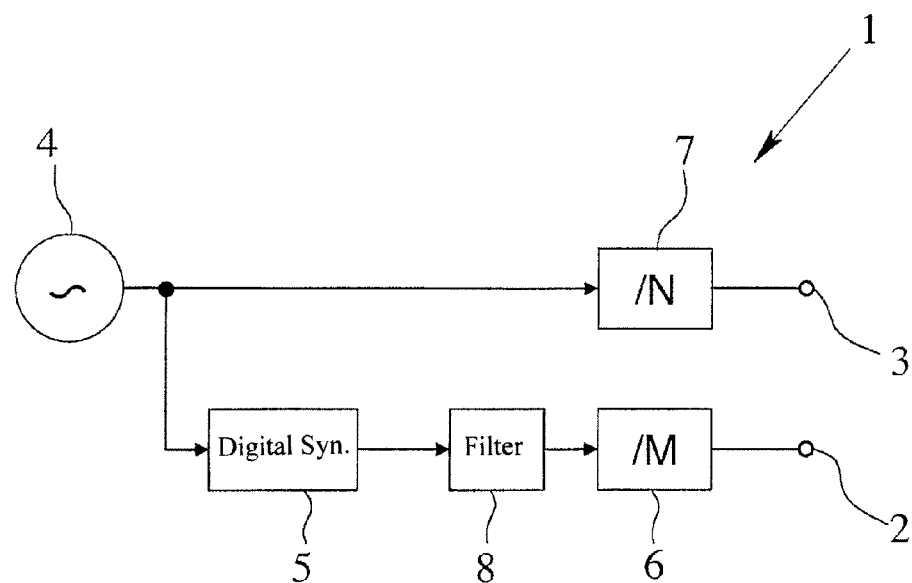
FIG. 1 shows a first exemplary embodiment of the frequency synthesizer in accordance with the invention with a first direct digital synthesizer and FIG. 2 shows an exemplary embodiment of the frequency synthesizer in accordance with the invention with a mixer.
Figure 2:
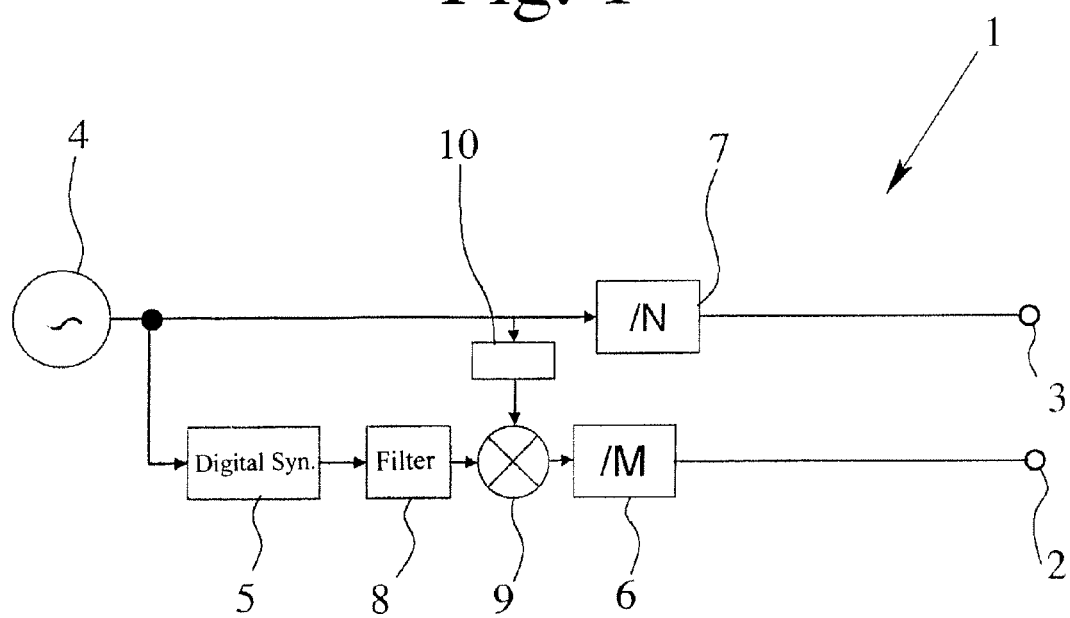

The frequency synthesizers 1 which are shown in FIGS. 1 and 2 are intended for a time base generator of a level measuring device which is not detailed and which works according to the radar principle. It is common to frequency synthesizers 1 that they have a first output 2 for output of a first frequency signal and a second output 3 for output of a second frequency signal. Furthermore they each have a reference oscillator 4 for producing a reference frequency signal. The first frequency signal and the second frequency signal have a small difference frequency of a few hertz relative to one another, thus as is required, for example, to implement slow motion serial sampling, as was described at the beginning. It is also common to the illustrated frequency synthesizers 1 that the first frequency signal can be produced at the first output 2 by interaction of the reference oscillator 4 with a first direct digital synthesizer 5 by specifically the first direct digital synthesizer 5 being provided between the reference oscillator 4 and the first output 2.

In the illustrated frequency synthesizers 1, the second frequency signal is derived from the reference oscillator 4 without interposition of another direct digital synthesizer and the existing direct digital synthesizer 5 is operated such that the noise spectrum which is inevitable in the operation of a direct digital synthesizer for different reasons is at least partially minimized.

As a first measure for partial minimization of the noise spectrum, the digital/analog converter which is encompassed by the direct digital synthesizers 5, and which however is no longer individually described, is operated at maximum resolution so that the quantization noise is minimum, and thus, the noise ratio, therefore the ratio of useful signal powers and the quantization noise power, is maximum; this is substantiated in the approximation of the generated direct digital synthesizer output signal which is the best possible at the largest possible quantization to an ideal sinusoidal signal which is thus free of noise frequencies.

In the direct digital synthesizers 5 shown in FIGS. 1 and 2, another measure is that the digital/analog converter encompassed by the direct digital synthesizers 5 is operated at a frequency in oversampling, especially is operated at the maximum frequency. In this way, nothing changes in the noise power produced altogether by quantization effects, but it is distributed over a larger frequency range than at a lower sampling rate, so that the noise power for the individual frequencies is relatively smaller than at a lower sampling rate. This is especially advantageous when, for example, large frequency ranges on the other side of the frequency of interest are masked out, for example, with a bandpass filter, and thus, a relatively large part of the quantization noise power can be masked out.

Quite special importance of minimizing the noise spectrum accrues to the measure implemented in the two frequency synthesizers 1, that specifically only those phase shifts with the direct digital synthesizers 5 used are employed which do not produce noise lines in conjunction with the initially explained phase truncation. Here, the direct digital synthesizers 5 in the frequency synthesizers 1 are made such that they comprise an n-bit phase accumulator and a phase storage which is triggered by the phase accumulator, and the phase accumulator can be parameterized with an n-bit shift word. The phase accumulator is operated clocked and constitutes essentially nothing more than a counter, the shift word for parameterization of the phase accumulator stipulating how many counter places are skipped in a counting pulse so that the phase accumulator together with the definable shift word is nothing more than an n-bit variable modulus counter.

The phase accumulator ideally contains as many amplitude values of the frequency signal to be produced as the phase accumulator has counter states. Optionally, the symmetry of the frequency signal which is to be produced is usable. However, here, only the m MSBs of the phase accumulator are used to trigger the phase storage; this is fundamentally conventional in many direct digital synthesizers 5 so that the phase storage is limited to a reasonable size. Here, the n-bit shift word is chosen such that it has a 1 at bit position (n-m) and a zero at all other bit positions. A shift word which has been chosen in this way ensures that periodic errors do not occur in the generation of the frequency signal generated by the direct digital synthesizer 5, as a result of which noise lines which necessarily correspond to the periodic errors in the amplitude spectrum of the frequency synthesizer or of the direct digital synthesizer 5 of the frequency synthesizer 1 are not produced either. It is apparent from the Bilde law for choosing a suitable shift word, that it is almost impossible, using two direct digital synthesizers 5, as known from the prior art, to produce frequency signals which are spaced apart by only a few hertz and at the same time which do not have noise lines as a result of phase truncation.

In the exemplary embodiment as shown in FIG. 1, first of all, there is a first frequency divider 6 between the direct digital synthesizer 5 and the first output 2. Here, the first output 2 can be supplied with the output signal of the first frequency divider 6; however, this is not critically necessary. The first frequency divider 6 makes it additionally possible to set the frequency of the frequency signal which can be output by way of the first output 2 of the frequency synthesizer 1. But one major advantage also lies in that the frequency synthesizer 1 and thus the direct digital synthesizer 5 which has been shifted upstream of the first output 2 are operated at a high frequency and a lower frequency output signal is produced by the first frequency divider 6 because the frequency divider leads to an additional noise line margin so that altogether an improved signal-to-noise ratio is implemented by the combination of a direct digital synthesizer 5 operated at high frequency with the first frequency divider 6. The same advantages are also entailed by the first frequency divider 6 in the circuit as shown in FIG. 2 in combination with the direct digital synthesizer 5 which is also fundamentally shifted upstream there.

Both circuits are characterized in that there is a second frequency divider 7 in addition between the reference oscillator 4 and the second output 3, here specifically, in particular, such that the second output 3 is supplied with the output signal of the second frequency divider 7. A further degree of freedom for setting the difference frequency and an additional noise line margin are also obtained by the second frequency divider 7. The following applies to the difference frequency achieved with the circuit as shown in FIG. 1:

$$\Delta f = |f_2 - f_1| = \left| \frac{f_{ref}}{N} - \frac{f_{DDS1}}{M} \right| \tag{2}$$

Here, $f_{ref}$ is the frequency of the reference frequency signal which is output from the reference oscillator 4.

In inverted position or regular position mixing of the output signal of the direct digital synthesizer 5 with the reference frequency signal and subsequently dividing the mixed signal down by the first frequency divider 6 the following applies to the difference frequency which has been attained:

$$\Delta f = |f_2 - f_1| = \left| \frac{f_{ref}}{N} - \frac{f_{ref} \pm f_{DDS}}{M} \right| \tag{3}$$

Equation 3 illustrates the extensive configuration possibilities in the setting of a suitable difference frequency $\Delta f$.

It has proven advantageous, as is also shown in FIGS. 1 and 2, if there is a first filter 8 between the output of the direct digital synthesizer 5 and the first output 2 of the frequency synthesizer 1, the first filter 8 here being made as a bandpass filter. In FIG. 1, the first filter 8 is connected between the direct digital synthesizer 5 and the first frequency divider 6 so that the output signal of the first filter 8 is supplied to the first frequency divider 6 there. The noise signals which have been removed in terms of frequency from the actual output signal of the direct digital synthesizer 5 are masked out by the first filter 8 which is made as a bandpass filter.

In the exemplary embodiment as shown in FIG. 2, between the first direct digital synthesizer 5 and the first output 2 there is also a mixer 9, and the first input of the mixer 9 can be supplied, at least indirectly, with the output signal of the first direct digital synthesizer 5 and the second input of the mixer 9 can be supplied, at least indirectly, with the output signal of the reference oscillator 4, and the first output 2 is supplied, at least indirectly, with the output signal of the mixer 9. Here, this mixer 9 is comprised of a multiplication element which multiplies the input signals by one another in the time domain, in this way, frequency conversion of the input signals being altogether effected. In other exemplary embodiments, which are not shown here, signal mixing is achieved by nonlinearities, with which as a result, however, the same effect can be achieved.

Another degree of freedom in the selection of the reference oscillator 4 being used and the frequency dividers 6, 7 and filters 8 being used, as well as the parameterization of the direct digital synthesizer 5 being effected by the mixer 9 and the resulting frequency conversion, for example, increasing the frequency/up-conversion. In this way, in a direct digital synthesizer 5, for example, other favorable frequencies can be set in the sense of phase truncation free of noise lines, in addition the advantage being achieved that up-conversion is not accompanied by deterioration of the phase noise, by the subsequent frequency division however a reduction of phase noise is achieved so that the frequency signals which can be achieved with the illustrated circuit have a high signal-to-noise ratio which cannot be implemented for example, with circuits using two direct digital synthesizers.

In the frequency synthesizer 1 as shown in FIG. 2 in which there is a mixer 9 between the output of the first filter 8 and the input of the first frequency divider 6, there is the series arrangement of the direct digital synthesizer 5, first filter 8, mixer 9, first frequency divider 6 and first output 2.

Noise signals, especially at the output of the mixer 9, can be suppressed by a second filter 10 between the output of the reference oscillator 4 and the second input of the mixer 9, the second filter 10, likewise, being made as a bandpass filter, as shown in FIG. 2.

What is claimed is:

1. Frequency synthesizer for a time base generator of a level measuring device which works according to the radar principle, comprising:
    a reference oscillator for producing a reference frequency signal,
    a direct digital synthesizer,
    at least one first output, and
    at least one second output,
    wherein the reference oscillator is arranged to interact with the direct digital synthesizer to produce at least one first frequency signal at the at least one first output,
    wherein the reference oscillator is arranged to produce a second frequency signal at said at least one second output without interconnection of the direct digital synthesizer, the second frequency signal being only slightly different from the first frequency signal,
    wherein the direct digital synthesizer is adapted to produce only an at least partially minimized noise spectrum, and
    wherein the direct digital synthesizer is adapted to operate with phase shifts which do not produce noise lines as a result of phase truncation.

2. Frequency synthesizer in accordance with claim 1, wherein a digital/analog converter is encompassed by the direct digital synthesizer is adapted to operate at maximum resolution.

3. Frequency synthesizer in accordance with claim 2, wherein the digital/analog converter which is encompassed by the direct digital synthesizer is adapted to operate at an oversampling frequency.

4. Frequency synthesizer in accordance with claim 1, wherein the direct digital synthesizer comprises an n-bit phase accumulator and a phase storage triggered by the phase accumulator, the phase accumulator being parameterizable with an n-bit shift word, only the m most significant bits (MSBs) of the phase accumulator activating the phase storage, the n-bit shift word at bit position (n-m) having a 1 and all lower bit positions of the shift word having an 0.

5. Frequency synthesizer in accordance with claim 1, wherein the direct digital synthesizer is adapted to operated at a maximum frequency.

6. Frequency synthesizer in accordance with claim 1, further comprising a first frequency divider between the direct digital synthesizer and the first output such that the first output is able to be supplied with the output signal of the first frequency divider.

7. Frequency synthesizer in accordance with claim 6, further comprising a second frequency divider between the reference oscillator and the second output such that the second output is able to be supplied with the output signal of the second frequency divider.

8. Frequency synthesizer in accordance with claim 1, further comprising a first filter between the output of the direct digital synthesizer and a first output of the frequency synthesizer.

9. Frequency synthesizer in accordance with claim 8, wherein the first filter is a bandpass filter, and the output signal of the first filter is received by a first frequency divider.

10. Frequency synthesizer for a time base generator of a level measuring device which works according to the radar principle, comprising:
    a reference oscillator for producing a reference frequency signal,
    a direct digital synthesizer,
    at least one first output,
    at least one second output, and
    a first filter between the output of the direct digital synthesizer and a first output of the frequency synthesizer, the first filter being a bandpass filter,
    wherein the reference oscillator is arranged to interact with the direct digital synthesizer to produce at least one first frequency signal at the at least one first output,
    wherein the reference oscillator is arranged to produce a second frequency signal at said at least one second output without interconnection of the direct digital synthesizer, the second frequency signal being only slightly different from the first frequency signal,
    wherein the direct digital synthesizer is adapted to operate with phase shifts, the only resulting truncations of which that produce noise lines are those which produce noise lines that are in a blocking region of the bandpass filter and wherein the bandpass filter is connected downstream of the direct digital synthesizer.

11. Frequency synthesizer in accordance with claim 1, wherein a mixer is provided between the direct digital synthesizer and the first output, wherein a first input of the mixer connected at least indirectly with the output signal of the direct digital synthesizer, wherein a second input of the mixer is connected at least indirectly with the output signal of the reference oscillator and wherein the first output is connected at least indirectly with the output signal of the mixer.

12. Frequency synthesizer in accordance with claim 11, further comprising a first filter between the output of the direct digital synthesizer and a first output of the frequency synthesizer and a first frequency divider between the direct digital synthesizer and the first output such that the first output is able to be supplied with the output signal of the first frequency divider, wherein a mixer is provided between the output of the first filter and the input of the first frequency divider in a series arrangement of the direct digital synthesizer, first filter, mixer, first frequency divider, and first output.

13. Frequency synthesizer in accordance with claim 12, wherein a second filter is provided between the output of the reference oscillator and the second input of the mixer, the second filter being a bandpass filter.

14. Level measurement device which operates according to the radar principle, comprising:
    a reference oscillator for producing a reference frequency signal,
    a direct digital synthesizer,
    at least one first output, and
    at least one second output,
    wherein the reference oscillator is arranged to interact with the direct digital synthesizer to produce at least one sampling frequency signal at the at least one first output,
    wherein the reference oscillator is arranged to produce a transmission frequency signal at said at least one second output without interconnection of the direct digital synthesizer, the transmission frequency signal being only slightly different from the sampling frequency signal,
    wherein the direct digital synthesizer is adapted to produce only an at least partially minimized noise spectrum, and
    wherein the direct digital synthesizer is adapted to operate with phase shifts which do not produce noise lines as a result of phase truncation.

15. Frequency synthesizer in accordance with claim 14, wherein the direct digital synthesizer comprises an n-bit phase accumulator and a phase storage which is triggered by the phase accumulator, and wherein the phase accumulator is able to be parameterized with an n-bit shift word.

* * * * *